US011923438B2

(12) United States Patent
Cheng et al.

(10) Patent No.: US 11,923,438 B2
(45) Date of Patent: Mar. 5, 2024

(54) FIELD-EFFECT TRANSISTOR WITH PUNCHTHROUGH STOP REGION

(71) Applicant: International Business Machines Corporation, Armonk, NY (US)

(72) Inventors: Kangguo Cheng, Schenectady, NY (US); Shogo Mochizuki, Mechanicville, NY (US); Juntao Li, Cohoes, NY (US); Choonghyun Lee, Chigasaki (JP)

(73) Assignee: International Business Machines Corporation, Armonk, NY (US)

( * ) Notice: Subject to any disclaimer, the term of this patent is extended or adjusted under 35 U.S.C. 154(b) by 261 days.

(21) Appl. No.: 17/480,791

(22) Filed: Sep. 21, 2021

(65) Prior Publication Data

US 2023/0091621 A1 Mar. 23, 2023

(51) Int. Cl.

| | |
|---|---|
| ***H01L 29/66*** | (2006.01) |
| ***H01L 27/088*** | (2006.01) |
| ***H01L 29/06*** | (2006.01) |
| ***H01L 29/08*** | (2006.01) |
| ***H01L 29/78*** | (2006.01) |

(52) U.S. Cl.

CPC ...... *H01L 29/66795* (2013.01); *H01L 27/088* (2013.01); *H01L 29/0649* (2013.01); *H01L 29/0847* (2013.01); *H01L 29/7851* (2013.01)

(58) Field of Classification Search

CPC ........... H01L 29/66795; H01L 29/0649; H01L 29/0847; H01L 29/7851; H01L 29/7853; H01L 29/1054; H01L 27/088; H01L 27/0886; H01L 21/823468

See application file for complete search history.

(56) References Cited

U.S. PATENT DOCUMENTS

| | | | |
|---|---|---|---|
| 8,242,568 B2 | 8/2012 | Ikeda et al. | |
| 8,957,477 B2 * | 2/2015 | Chang | H01L 29/7851 257/347 |
| 9,735,155 B2 | 8/2017 | Cheng et al. | |
| 9,947,663 B2 * | 4/2018 | Basker | H01L 29/66803 |
| 10,096,524 B1 | 10/2018 | Bi et al. | |
| 10,141,430 B1 | 11/2018 | Fung | |
| 10,290,636 B2 | 5/2019 | Liu et al. | |
| 10,707,208 B2 | 7/2020 | Cheng et al. | |
| 11,276,760 B2 * | 3/2022 | Bhimarasetti | H01L 29/66803 |
| 2016/0322501 A1 * | 11/2016 | Cheng | H01L 29/0653 |
| 2017/0236917 A1 * | 8/2017 | Nowak | H01L 29/785 257/401 |

OTHER PUBLICATIONS

J. B. Chang et al., "Scaling of SOI FinFETs Down to Fin Width of 4 nm for the 10nm Technology Node," 2011 Symposium on VLSI Technology—Digest of Technical Papers, 2011, pp. 12-13.

(Continued)

*Primary Examiner* — Dao H Nguyen

(74) *Attorney, Agent, or Firm* — Samuel Waldbaum; Ryan, Mason & Lewis, LLP

(57) ABSTRACT

A semiconductor structure includes a substrate comprising a semiconductor material, and a fin on the substrate. The fin includes a first portion formed from the semiconductor material and a second portion including a channel region. The first portion has a first thickness and the second portion has a second thickness greater than the first thickness. A spacer is disposed on sides of the first portion of the fin.

20 Claims, 4 Drawing Sheets

104b
116
100
118
114
104
110
112
102
104a

(56) References Cited

OTHER PUBLICATIONS

C. H. Lee et al., "Understanding the Interfacial Layer Formation on Strained Si1-xGex Channels and Their Correlation to Inversion Layer Hole Mobility, " 2017 Symposium on VLSI Technology, 2017, pp. T126-T127.

B. Kim et al., "Investigation of Fixed Oxide Charge and Fin Profile Effects on Bulk FinFET Device Characteristics," in IEEE Electron Device Letters, vol. 34, No. 12, Dec. 2013, pp. 1485-1487.

* cited by examiner

FIELD-EFFECT TRANSISTOR WITH PUNCHTHROUGH STOP REGION

BACKGROUND

This disclosure relates generally to semiconductor fabrication techniques and, in particular, to structures and methods for fabricating field-effect transistor devices.

Fin field-effect transistor (FinFET) devices include a transistor architecture that uses raised source-to-drain channel regions, referred to as fins. Known FinFET devices include fins with source/drain regions on lateral sides of the fins, so that current flows in a horizontal direction (e.g., parallel to a substrate) between source/drain regions at opposite ends of the fins in the horizontal direction. As horizontal devices are scaled down, there is reduced space for metal gate and source/drain contacts, which leads to degraded short-channel control and increased middle-of-the-line (MOL) resistance.

SUMMARY

According to an exemplary embodiment, a semiconductor structure comprises a substrate which comprises a semiconductor material. The semiconductor structure further comprises a fin on the substrate. The fin comprises a first portion formed from the semiconductor material and a second portion comprising a channel region. The first portion has a first thickness and the second portion has a second thickness greater than the first thickness. The semiconductor structure further comprises a spacer disposed on sides of the first portion of the fin.

According to an exemplary embodiment, an integrated circuit comprises a plurality of field-effect transistor devices, wherein at least one of the field-effect transistor devices comprises a substrate which comprises a semiconductor material. The field-effect transistor device further comprises a fin on the substrate. The fin comprises a first portion formed from the semiconductor material and a second portion comprising a channel region. The first portion has a first thickness and the second portion has a second thickness greater than the first thickness. The field-effect transistor device further comprises a spacer disposed on sides of the first portion of the fin.

According to an exemplary embodiment, a method for fabricating a field-effect transistor device comprises depositing a silicon germanium layer on a substrate comprising a semiconductor material. The method further comprises forming a fin on the substrate. The fin comprises a first portion formed from the semiconductor material and a second portion formed from the silicon germanium layer. The first portion has a first thickness and the second portion has a second thickness equal to the first thickness. The method further comprises selectively removing a portion of the semiconductor material from the fin such that the second thickness has a thickness greater than the first thickness. The method further comprises forming a spacer on sides of the semiconductor material of the fin.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which.

DETAILED DESCRIPTION

Figure 1B:
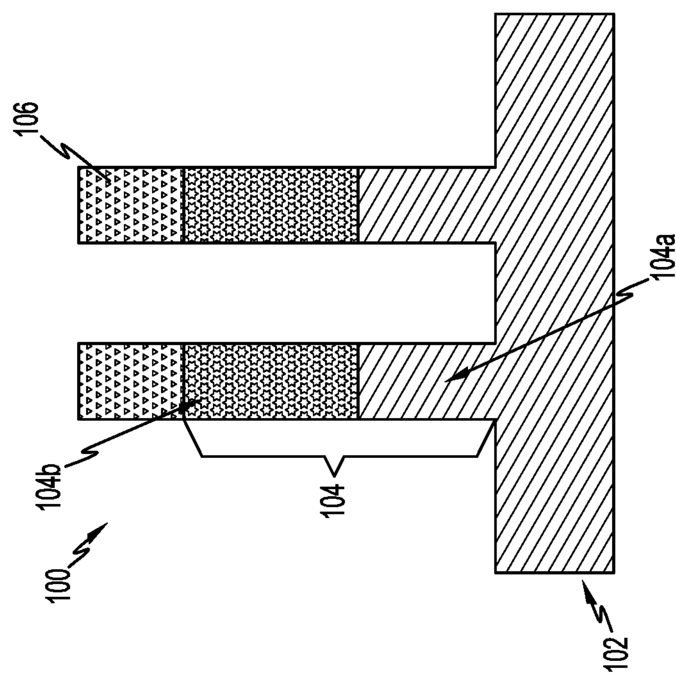
FIG. 1B is a cross-sectional view of the semiconductor structure taken along the Y-Y axis of FIG. 1A at a first-intermediate fabrication stage, according to an illustrative embodiment.

This disclosure relates generally to transistors, and more particularly to fin-shaped field effect transistors (FinFET) and methods for their fabrication. Exemplary embodiments will now be discussed in further detail with regard to semiconductor devices and methods of manufacturing same and, in particular, to FinFET devices having minimal to no dopant diffusion from the punchthrough stop region to a silicon germanium (SiGe) fin.

FinFETs are a promising option for technology scaling for 5 nm and beyond. It is desired to have SiGe as the channel material to improve the performance of a p-type field-effect transistor (PFET). In a typical SiGe FinFET fabrication process, SiGe is epitaxially grown on a silicon substrate in a PFET region followed by fin patterning to form SiGe fins. Next, N-type dopants (e.g., phosphorus or arsenic) are added to the silicon underneath the SiGe fins to form a punchthrough stop (i.e., an n-well) to reduce source/drain leakage below the SiGe fin. However, there are several issues directed to using dopants to form a junction isolation. One issue is that it is difficult to place a punchthrough stop region underneath the SiGe fin. In additional, undesirable dopant diffusion from the punchthrough stop region into the SiGe fin channel (e.g., n-type dopants such as phosphorus/arsenic which have a much higher diffusion rate in SiGe than that in Si) results in an increase of device variability and mobility degradation. Accordingly, there is a need to form an SiGe FinFET without the above drawbacks.

Accordingly, illustrative, non-limiting embodiments herein provide a dopant-free source/drain punchthrough stop region (PTS) to create a high threshold voltage (Vt) Si segment under the SiGe fin channel. Other advantages provided herein according to illustrative, non-limiting embodiments include having (i) a larger bandgap of PTS Si than SiGe fin channel; (ii) a narrower PTS Si than SiGe fin channel; (iii) a thicker dielectric on the PTS Si sidewalls than the thin gate dielectric on SiGe fin channel; and (iv) the dielectric having positive charges to improve the electrical isolation between source and drain.

It is to be understood that the various layers and/or regions shown in the accompanying drawings are not drawn to scale, and that one or more layers and/or regions of a type commonly used in semiconductor devices may not be explicitly shown in a given drawing. This does not imply that the layers and/or regions not explicitly shown are omitted from the actual devices. In addition, certain elements may be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the terms "about" or "substantially" as used herein imply that a small margin of error may be present, such as 1% or less than the stated amount.

The semiconductor devices and methods for forming same in accordance with embodiments described herein can be employed in applications, hardware, and/or electronic systems. Suitable hardware and systems for implementing illustrative embodiments may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments. Given the teachings of illustrative embodiments provided herein, one of ordinary skill in the art will be able to contemplate other implementations and applications of embodiments described herein.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Referring now to the drawings in which like numerals represent the same of similar elements, FIGS. 1A-6B illustrate various processes for fabricating a semiconductor structure having minimal to no dopant diffusion from the punchthrough stop region to an SiGe fin. Note that the same reference numeral (100) is used to denote the semiconductor structure through the various intermediate fabrication stages illustrated in FIGS. 1A through 6B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-6B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 1A:
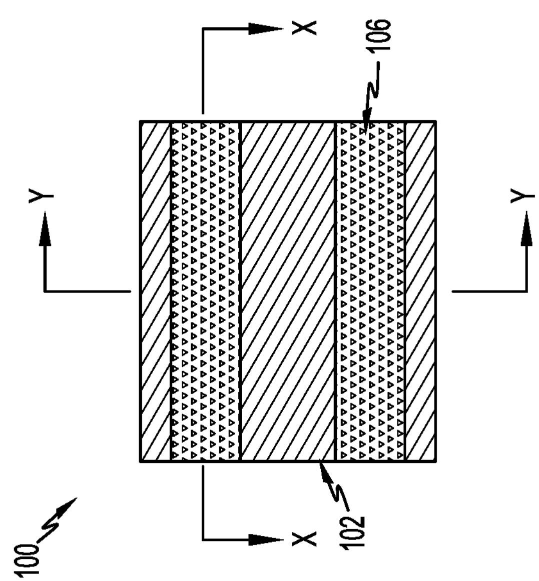
FIG. 1A is a top view illustrating a semiconductor structure for use at a first-intermediate fabrication stage, according to an illustrative embodiment.

FIG. 1A is a top view illustrating a semiconductor structure 100 for use at a first-intermediate fabrication stage. FIG. 1B is a cross-sectional view of the semiconductor structure 100 taken along the Y-Y axis of FIG. 1A at the first-intermediate fabrication stage. During this stage vertical fins 104 including substrate portion 104*a* and channel region 104*b* with each fin 104 having sidewalls for semiconductor structure 100 are formed. In one embodiment, each fin 104 extends vertically with respect to semiconductor substrate 102. As will be discussed below, substrate portion 104*a* is a punchthrough stop (PTS) region which is relatively dopant free. In one embodiment, substrate portion 104*a* is a punchthrough stop (PTS) region which is dopant free. Although two vertical fins for the set of fins 104 are shown, the number of fins should not be considered limiting. For example, one fin can be used herein. Thus, a "set of fins" as used herein can be considered as including one or more fins. FIGS. 1A and 1B show a semiconductor structure 100 having a semiconductor substrate 102. Semiconductor substrate 102 can be a semiconductor material including, for example, silicon or other like semiconductor materials. In addition, multiple layers of the semiconductor materials can be used as the semiconductor material of the substrate. Semiconductor substrate 102 can be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide. In one illustrative embodiment, semiconductor substrate 102 is silicon.

Channel region 104*b* is formed by epitaxially growing a silicon germanium ($SiGe_x$) layer (not shown) on semiconductor substrate 102. Representative examples of $SiGe_x$ can be $SiGe_{20}$, $SiGe_{25}$, $SiGe_{30}$ . . . $SiGe_{65}$. The terms "epitaxial grown" and "epitaxially forming and/or growing" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Hardmask 106 is deposited over the SiGe layer by any conventional technique. For example, hardmask 106 can be deposited by, for example, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Suitable material for hardmask 106 includes, for example, SiN, SiBCN, SiCN, SiN, SiCO, SiO, and SiNOC.

To form the vertical fins 104, lithography and etching are performed using any type of patterning technique such as a direct-print lithography or a sidewall-image-transfer (SIT) process. A direct-print lithography process maybe one of **193*i* lithography or extreme ultra-violet (EUV) lithography, familiar to those skilled in the art. A SIT process may be referred to as a self-aligned double patterning (SADP) process or self-aligned quadruple patterning (SAQP). Each fin 104 includes a first portion, i.e., substrate portion 104*a*, formed from the semiconductor material, and a second portion, i.e., channel region 104*b***, formed form the SiGe layer.

Figure 2:
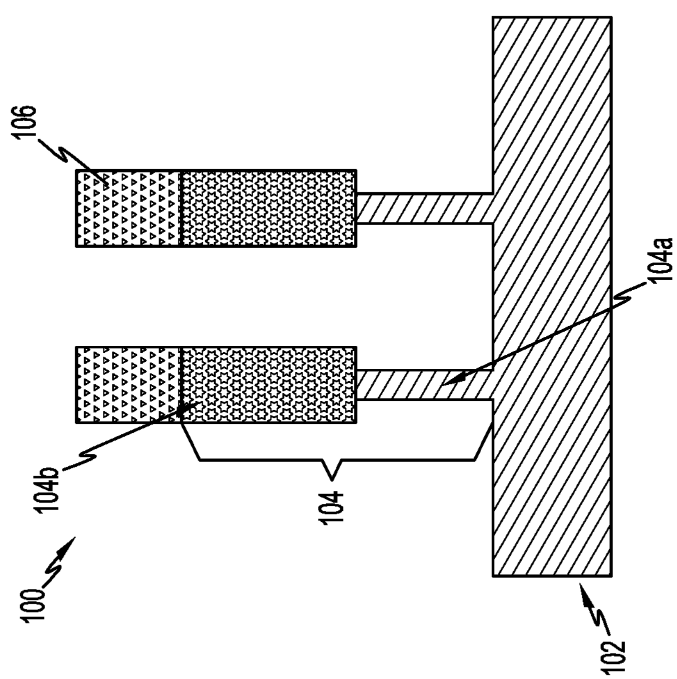
FIG. 2 is a cross-sectional view illustrating the semiconductor structure taken along the Y-Y axis of FIG. 1A at a second-intermediate fabrication stage, according to an illustrative embodiment.

FIG. 2 illustrates semiconductor structure 100 at a second-intermediate fabrication stage. During this stage, the substrate portion **104*a* of fins 104 is trimmed using, for example, an isotropic etch selective to the substrate portion 104*a* over channel region 104*b*. In one embodiment, the substrate portion 104*a* of fins 104 is trimmed by reducing the thickness of substrate portion 104*a* from 30% to 70% of its original thickness. In one embodiment, the substrate portion 104*a* of fins 104 is trimmed by reducing the thickness of substrate portion 104*a* from 40% to 60% of its original thickness. For example, in one embodiment, substrate portion 104*a* of fins 104 is trimmed by reducing the thickness of substrate portion 104*a* from a thickness of about 8 nanometers (nm) to a thickness of 4 nm, i.e., each side of substrate portion 104*a* is trimmed by reducing the thickness by about 2 nm per side. Accordingly, in one illustrative embodiment, a substrate portion 104*a* has a first thickness and channel region 104*b* has a second thickness greater than the thickness of substrate portion 104*a*. In general, when a semiconductor material is reduced to several nanometers, its bandgap goes up due to quantum effects. For example, by reducing the lateral thickness of the silicon in substrate portion 104*a* from 8 nm to 4 nm, the bandgap of the silicon in the substrate portion 104*a*** goes up. The higher the bandgap, the better electrical isolation can be achieved.

Figure 3:
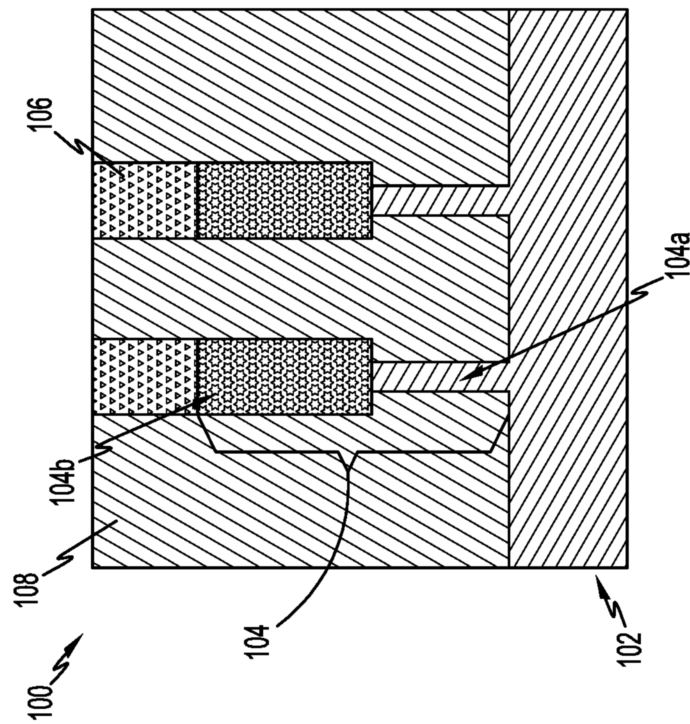
FIG. 3 is a cross-sectional view illustrating the semiconductor structure taken along the Y-Y axis of FIG. 1A at a third-intermediate fabrication stage, according to an illustrative embodiment.

FIG. 3 illustrates semiconductor structure 100 at a third-intermediate fabrication stage. During this stage, dielectric layer 108 is deposited on semiconductor structure 100 and over fins 104. The dielectric layer 108 can be deposited using deposition techniques including, but not limited to, CVD, PECVD, RFCVD, PVD, ALD, and/or sputtering. In one embodiment, dielectric layer 108 is formed from a spin-on dielectric material. In one embodiment, dielectric layer 108 is a dielectric material having positive charges. Suitable material for dielectric layer 108 includes, for example, SiN, SiCN, and SiCO. Dielectric layer 108 can be planarized by chemical mechanical polishing (CMP).

Figure 4:
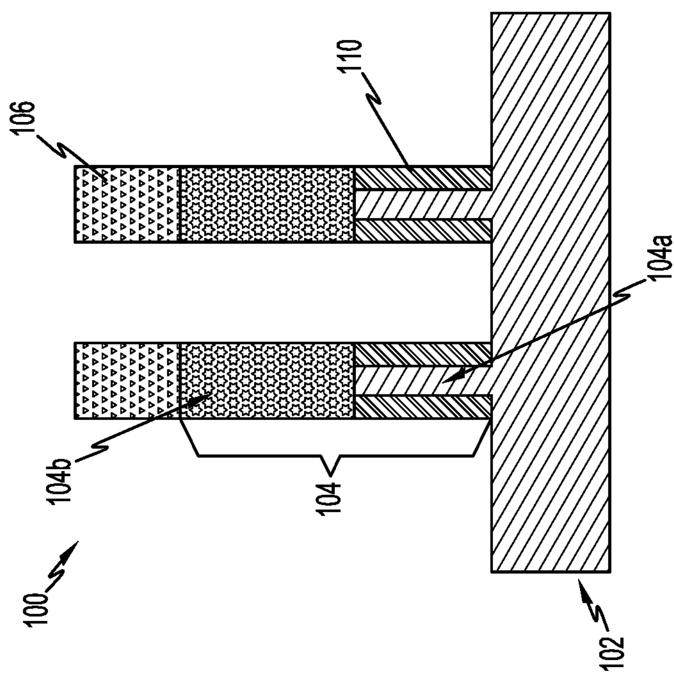
FIG. 4 is a cross-sectional view illustrating the semiconductor structure taken along the Y-Y axis of FIG. 1A at a fourth-intermediate fabrication stage, according to an illustrative embodiment.

FIG. 4 illustrates semiconductor structure 100 at a fourth-intermediate fabrication stage. During this stage, dielectric layer 108 is selectively removed to form spacers 110 on substrate portion **104*a* under channel region 104*b* of each fin 104. Dielectric layer 108 is selectively removed using directional etching techniques, e.g., reactive ion etching (RIE). The hardmask 106 serves as the masking layer and dielectric layer 108 not covered by the hardmask 106 is removed. In one embodiment, spacers 110 are in-line with channel region 104*b* of each fin 104. In other words, the spacer 110 is self-aligned to the channel region 104*b* without the need of any additional lithography step. In one embodiment, the lateral thickness of the spacer 110 is about 2 nm. The substrate portion 104*a* is surrounded by the spacer 110. The positive charges in the spacer introduces electrons in the substrate portion 104*a*, effectively improving the electrical isolation between, for example, a p-type source and a p-type drain of a PFET. As a result, the n-type dopants needed in the punchthrough stop region can be greatly reduced or even eliminated, thereby avoiding the problem with undesired dopant diffusion from the punchthrough stop region to the channel region, particularly for a PFET with an SiGe channel. In one embodiment, the combination of the trimmed substrate portion 104*a* (punchthrough stop region) with a lateral thickness of about 3 nm and a positively charged spacer 110** having a charge density of about $1\times10^{20}$ $cm^{-3}$ can completely eliminates the need of n-type dopants in the punchthrough stop region for a PFET. By greatly reducing or eliminating the dopants in the punchthrough stop region, device variability is greatly reduced and carrier mobility is greatly improved.

Figure 5:
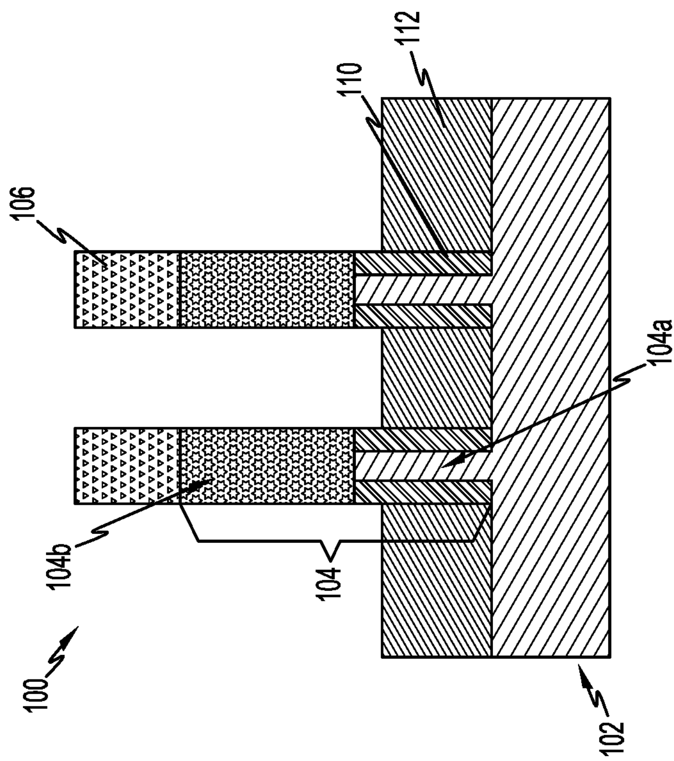
FIG. 5 is a cross-sectional view illustrating the semiconductor structure taken along the Y-Y axis of FIG. 1A at a fifth-intermediate fabrication stage, according to an illustrative embodiment.

FIG. 5 illustrates semiconductor structure 100 at a fifth-intermediate fabrication stage. During this stage, shallow trench isolation (STI) layer 112 is deposited on substrate 102 and around each fin 104 by methods known in the art. STI layer 112 comprises a dielectric material such as silicon oxide, silicon oxynitride, silicon nitride, silicon carbon oxynitride (SiCON), or any suitable combination of those dielectric materials. In one illustrative embodiment, shallow trench isolation layer 112 is a shallow trench isolation oxide layer. In one embodiment, the STI layer 112 is formed by high density plasma chemical vapor deposition (HDP CVD)

to deposit, e.g., silicon dioxide in the shallow trenches. The STI deposition is followed by a planarizing process such as a CMP operation and etch back process so that the top surface of STI layer 112 is below a top surface of substrate portion 104*a* of each fin 104.

Figure 6B:
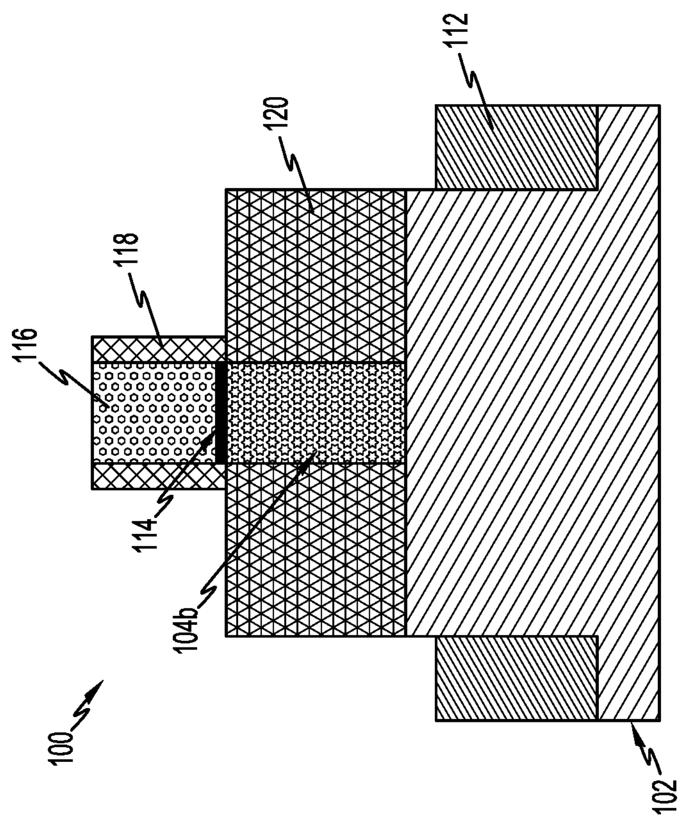
FIG. 6B is a cross-sectional view illustrating the semiconductor structure taken along the X-X axis of FIG. 1A at the sixth-intermediate fabrication stage, according to an illustrative embodiment.
Figure 6A:
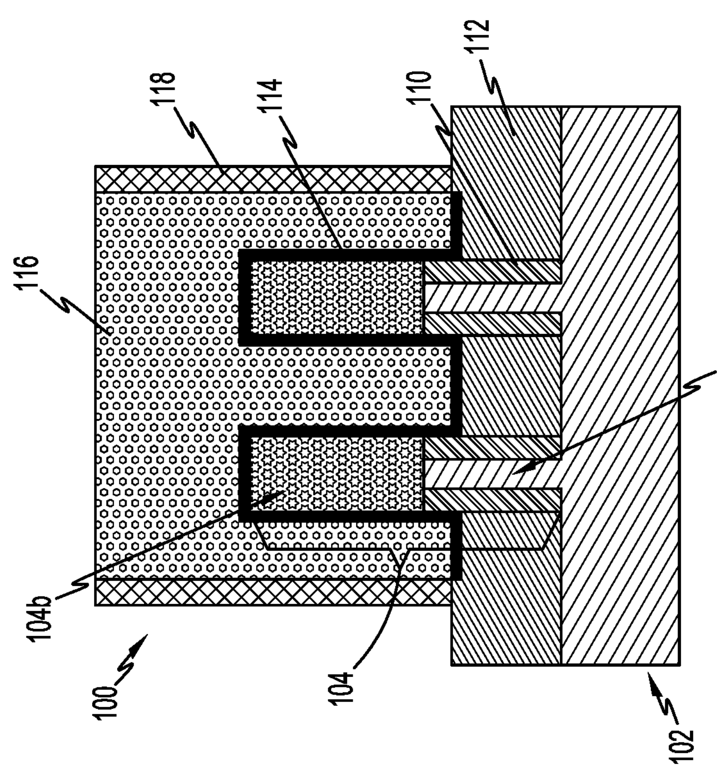
FIG. 6A is a cross-sectional view illustrating the semiconductor structure taken along the Y-Y axis of FIG. 1A at a sixth-intermediate fabrication stage, according to an illustrative embodiment.

FIGS. 6A and 6B illustrate semiconductor structure 100 at a sixth-intermediate fabrication stage. During this stage, a metal gate is formed on semiconductor structure 100. First, a gate dielectric layer 114 is deposited on semiconductor structure 100 employing, for example, CVD, ALD, PVD, etc. The gate dielectric layer 114 includes, for example, a high-K material such as hafnium oxide ($HfO_2$), HfSiO, HfSiON, AlO, $Al_2O_3$, Titanium oxide ($TiO_2$), Lanthanum oxide ($La_2O_3$) or a combination or stack thereof. A work function metal (not shown) can be formed on a portion of dielectric layer 114 employing, for example, CVD, sputtering, or plating. The work function metal includes one or more metals having a function suitable to tune the work function of an n-type field-effect transistor (NFET) or a an p-type field-effect transistor (PFET). For example, suitable work function metals include titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof.

Next, gate layer 116 is deposited on the gate dielectric layer 114 using any convention deposition technique such as ALD, CVD, PVD, sputtering, plating, evaporation, ion beam deposition, electron beam deposition, laser assisted deposition, chemical solution deposition, etc. In one embodiment, gate layer 116 is a conductive material or a combination of multiple conductive materials that can serve as both gate conductor and work function metal. The conductive material can include any suitable conductive material such as, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

Sidewall spacers 118 are then deposited on the exterior sidewall surfaces of gate 116. The sidewall spacers 118 may be formed, for example, by forming a conformal layer of sidewall dielectric and removing horizontal portions with a directional etch, e.g., RIE. In an embodiment, the sidewall spacers 118 can be a nitride, for example, a silicon nitride (SiN), or an oxynitride, for example, silicon oxynitride (SiON). In some exemplary embodiments, sidewall spacers 118 can include a material that is resistant to some etching processes such as, for example, HF chemical etching or chemical oxide removal etching.

FIG. 6B further shows source/drain region 120 formed on each side of channel region 104*b* of fin 104 by, for example, forming a source/drain (S/D) epitaxially grown layer (e.g., an NFET S/D epi or PFET S/D epi) on a portion of substrate 102 and around the exposed sidewalls of channel region 104*b* of fin 104. The epitaxially grown source/drain region 120 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$.

It is to be understood that the methods discussed herein for fabricating semiconductor structures (e.g., a FinFET) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with non-limiting illustrative embodiments can be employed in applications, hardware, and/or electronic systems. Suitable hardware and systems for implementing the non-limiting illustrative embodiments may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the non-limiting illustrative embodiments provided herein, one of ordinary skill in the art will be able to contemplate other implementations and applications of the techniques described herein.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A semiconductor structure, comprising:

a substrate comprising a semiconductor material;

a fin on the substrate, the fin comprising a first portion formed from the semiconductor material and a second portion comprising a channel region, wherein the first portion has a first thickness and the second portion has a second thickness greater than the first thickness;

a spacer disposed on sides of the first portion of the fin; and a gate dielectric layer disposed on exterior surfaces of the second portion of the fin and on a portion of a sidewall of the spacer;

wherein sidewalls of the spacer disposed on sides of the first portion of the fin are aligned with a sidewall of the second portion of the fin.

2. The semiconductor structure according to claim 1, wherein the semiconductor material is silicon and the channel region is silicon germanium.

3. The semiconductor structure according to claim 1, wherein the spacer is a spacer having a positive charge.

4. The semiconductor structure according to claim 3, wherein the first portion is a punchthrough stop region which is dopant free.

5. The semiconductor structure according to claim 1, wherein the spacer is self-aligned with the second portion.

6. The semiconductor structure according to claim 1, wherein the spacer has a third thickness and further wherein the second thickness is equal to a sum of the first thickness and the third thickness.

7. The semiconductor structure according to claim 1, further comprising a shallow trench isolation layer disposed on the substrate and around the first portion of the fin.

8. The semiconductor structure according to claim 1, further comprising a source/drain region disposed on at least a portion of the substrate and around the second portion of the fin.

9. The semiconductor structure according to claim 8, further comprising a gate structure disposed above the source/drain region and on a top surface of the fin.

10. The semiconductor structure according to claim 1, further comprising:

a shallow trench isolation layer disposed on the substrate and around the first portion of the fin; and a gate structure disposed on the shallow trench isolation layer and surrounding the fin.

11. An integrated circuit, comprising:

a plurality of field-effect transistor devices, wherein at least one of the field-effect transistor devices comprises:

a substrate comprising a semiconductor material;

a fin on the substrate, the fin comprising a first portion formed from the semiconductor material and a second portion comprising a channel region, wherein the first portion has a first thickness and the second portion has a second thickness greater than the first thickness;

a spacer disposed on sides of the first portion of the fin; and a gate dielectric layer disposed on exterior surfaces of the second portion of the fin and on a portion of a sidewall of the spacer;

wherein sidewalls of the spacer disposed on sides of the first portion of the fin are aligned with a sidewall of the second portion of the fin.

12. The integrated circuit according to claim 11, wherein the semiconductor material is silicon and the channel region is silicon germanium.

13. The integrated circuit according to claim 11, wherein the spacer is a spacer having a positive charge.

14. The integrated circuit according to claim 13, wherein the first portion is a punchthrough stop region which is dopant free.

15. The integrated circuit according to claim 11, wherein the spacer is self-aligned with the second portion.

16. The integrated circuit according to claim 11, wherein the spacer has a third thickness and further wherein the second thickness is equal to a sum of the first thickness and the third thickness.

17. The integrated circuit according to claim 11, further comprising a source/drain region disposed on at least a portion of the substrate and around the second portion of the fin.

18. The integrated circuit according to claim 17, further comprising a gate structure disposed above the source/drain region and on a top surface of the fin.

19. The integrated circuit according to claim 11, further comprising:

a shallow trench isolation layer disposed on the substrate and around the first portion of the fin; and a gate structure disposed on the shallow trench isolation layer and surrounding the fin.

20. A method for fabricating a semiconductor structure, comprising:

depositing a silicon germanium layer on a substrate comprising a semiconductor material;

forming a fin on the substrate, the fin comprising a first portion formed from the semiconductor material and a second portion formed from the silicon germanium layer, wherein the first portion has a first thickness and the second portion has a second thickness equal to the first thickness;

selectively removing a portion of the semiconductor material from the fin such that the second thickness has a thickness greater than the first thickness; and forming a spacer on sides of the semiconductor material of the fin.

* * * * *